United States Patent
Tanaka et al.

(10) Patent No.: US 11,468,961 B2
(45) Date of Patent: Oct. 11, 2022

(54) SEMICONDUCTOR MEMORY DEVICE, MEMORY CONTROLLER, AND ERROR NOTIFICATION METHOD

(71) Applicant: PANASONIC INTELLECTUAL PROPERTY MANAGEMENT CO., LTD., Osaka (JP)

(72) Inventors: Kazuhito Tanaka, Shiga (JP); Masaki Maeda, Hiroshima (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 61 days.

(21) Appl. No.: 16/921,255

(22) Filed: Jul. 6, 2020

(65) Prior Publication Data

US 2021/0012852 A1  Jan. 14, 2021

(30) Foreign Application Priority Data

Jul. 9, 2019 (JP) .............................. JP2019-127434

(51) Int. Cl.
*G11C 29/00* (2006.01)
*G11C 29/42* (2006.01)
(Continued)

(52) U.S. Cl.
CPC .............. *G11C 29/42* (2013.01); *G11C 29/10* (2013.01); *G11C 29/36* (2013.01); *G11C 29/44* (2013.01); *G11C 2029/4402* (2013.01)

(58) Field of Classification Search
CPC ......... G11C 29/42; G11C 29/10; G11C 29/36; G11C 29/44; G11C 2029/4402
See application file for complete search history.

(56) References Cited

U.S. PATENT DOCUMENTS 7,225,099 B1* 5/2007 O'Dwyer ................. G01K 7/01
374/E7.035
11,309,013 B2* 4/2022 Moon ................. G11C 11/4074
(Continued)

FOREIGN PATENT DOCUMENTS

| JP | 2009-021981 | 1/2009 |
| JP | 2010-118137 | 5/2010 |
| JP | 2011-134435 | 7/2011 |

OTHER PUBLICATIONS

Office Action from Japan Patent Office (JPO) in Japanese Patent Appl. No. 2019-127434, dated Aug. 24, 2021, together with a partial English language translation.

*Primary Examiner* — Tuan T Nguyen
(74) *Attorney, Agent, or Firm* — Greenblum & Bernstein, P.L.C.

(57) ABSTRACT

A semiconductor memory device includes a data bus terminal group for outputting read data to an external device or inputting write data from an external device, a first terminal from or into which 1-bit data is output or input, a DBI circuit that executes a Data Bus Inversion (DBI) function, an error detection circuit that detects an internal error, and an information superimposing circuit that superimposes predetermined output information onto the 1-bit data to be output from the first terminal and the read data to be output from the data bus terminal group. The predetermined output information includes first output information indicating whether or not an output bit pattern of the data bus terminal group is inverted, and second output information indicating whether or not an internal error has been detected by the error detection circuit.

8 Claims, 8 Drawing Sheets

(51) Int. Cl.
*G11C 29/44* (2006.01)
*G11C 29/36* (2006.01)
*G11C 29/10* (2006.01)

(56) References Cited

U.S. PATENT DOCUMENTS

| | | | |
|---|---|---|---|
| 2002/0004921 A1* | 1/2002 | Muranaka | G11C 29/42 |
| | | | 714/704 |
| 2009/0019344 A1 | 1/2009 | Yoon et al. | |
| 2009/0027982 A1* | 1/2009 | Kobayashi | G11C 29/026 |
| | | | 365/201 |
| 2010/0118635 A1 | 5/2010 | Bae et al. | |
| 2011/0153939 A1 | 6/2011 | Choi | |
| 2015/0067437 A1* | 3/2015 | Bains | G06F 11/1048 |
| | | | 714/758 |
| 2018/0277175 A1* | 9/2018 | Kondo | G11C 29/36 |
| 2020/0081769 A1* | 3/2020 | Riho | G11C 29/74 |
| 2021/0012852 A1* | 1/2021 | Tanaka | G11C 29/10 |
| 2021/0288848 A1* | 9/2021 | Boh | H04L 25/4906 |

* cited by examiner

SEMICONDUCTOR MEMORY DEVICE, MEMORY CONTROLLER, AND ERROR NOTIFICATION METHOD

CROSS REFERENCE TO RELATED APPLICATION

The present application is based on and claims priority of Japanese Patent Application No. 2019-127434 filed on Jul. 9, 2019.

FIELD

The present disclosure relates to a semiconductor memory device and an error notification method, and particularly relates to a semiconductor memory device which is SDRAM and an error notification method for the same.

BACKGROUND

PTL 1 discloses Synchronous Dynamic Random Access Memory (SDRAM) have a data bus inversion (DBI) function. PTL 2 discloses SDRAM having a DBI function as well as a circuit that detects bit errors and generates error detection code.

CITATION LIST

Patent Literature

PTL 1: Japanese Unexamined Patent Application Publication No. 2010-118137
PTL 2: Japanese Unexamined Patent Application Publication No. 2009-21981

SUMMARY

However, the SDRAM disclosed in PTL 1 and 2 can be improved upon. In view of this, the present disclosure provides a semiconductor memory device, a memory controller, and an error notification method capable of improving on the above related art.

A semiconductor memory device according to one aspect of the present disclosure includes a data bus terminal group for outputting read data to an external device or inputting write data from an external device, a first terminal from or into which 1-bit data is output or input, a DBI circuit that executes a Data Bus Inversion (DBI) function, an error detection circuit that detects an internal error, and an information superimposing circuit that superimposes predetermined output information onto the 1-bit data to be output from the first terminal and the read data to be output from the data bus terminal group. The predetermined output information includes first output information indicating whether or not an output bit pattern of the data bus terminal group is inverted, and second output information indicating whether or not an internal error has been detected by the error detection circuit.

Additionally, a memory controller according to one aspect of the present disclosure is a memory controller that controls readout and writing from and to a semiconductor memory device. The memory controller includes a data bus terminal group for outputting write data to the semiconductor memory device or inputting read data from the semiconductor memory device, a first terminal from or into which 1-bit data is output or input, a DBI circuit that executes a DBI function, and an information detection circuit that detects predetermined output information superimposed on the 1-bit data input to the first terminal from the semiconductor memory device and on an input bit pattern serving as memory read data input to the data bus terminal group from the semiconductor memory device. The predetermined output information includes first output information indicating whether or not the input bit pattern input from the data bus terminal group is inverted, and second output information indicating whether or not an internal error in the semiconductor memory device has been detected.

Additionally, an error notification method according to one aspect of the present disclosure is an error notification method for a semiconductor memory device. The device includes a data bus terminal group, a first terminal, and a DBI circuit that executes a DBI function. The method includes detecting a presence or absence of an internal error in the semiconductor memory device, and superimposing predetermined output information onto 1-bit data to be output from the first terminal and read data to be output from the data bus terminal group. The predetermined output information includes first output information indicating whether or not an output bit pattern from the data bus terminal group is inverted, and second output information indicating whether or not an internal error has been detected by an error detection circuit in the semiconductor memory device.

Note that these comprehensive or specific aspects may be realized by a system, a method, an integrated circuit, a computer program, or a computer-readable recording medium such as a CD-ROM, or may be implemented by any desired combination of systems, devices, methods, integrated circuits, computer programs, and recording media.

A semiconductor memory device, a memory controller, and an error notification method according to one aspect of the present disclosure are capable of improving on the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENT

Underlying Knowledge Serving as Basis of Present Disclosure

The inventor(s) of the present disclosure discovered that the semiconductor memory devices described in the Related Art section, which are SDRAM, have the following problems.

Refinements in the manufacturing processes of Double Data Rate 4 (DDR4)- and Low Power DDR4 (LPDDR4)-generation semiconductor memory devices has led to finer sizes for memory cells (lower capacities in capacitors serving as storage elements). This has made it necessary to take active measures against data corruption in the DRAM (and against a drop in retention performance in particular).

Manufacturers are therefore making efforts to refine semiconductor manufacturing processes for the purpose of improving yields. For example, installing an Error Correcting Code (ECC) circuit in a semiconductor chip within DRAM (on-die ECC) and using a new command corresponding to ECC circuits (Mask Write) is one measure being employed in DDR4 and LPDDR4.

However, SDRAM such as that disclosed in PTL 1 and PTL 2 has a problem in that despite internal errors such as bit errors being detected within the semiconductor chip serving as the SDRAM, devices outside the semiconductor chip (e.g., a DRAM controller which controls memory access) cannot detect those internal errors. The device outside the semiconductor chip therefore cannot make early warnings or take prompt measures for internal errors.

To rephrase, there is a problem in that error correction using on-die ECC is performed in a closed state within the DRAM semiconductor chip, and there is no way to know the state of error correction from outside the DRAM.

In terms of functional safety, the system recognizing that an error has been detected is more important than correcting errors within the DRAM, and a method for notifying a device external to the DRAM that an error has been detected with the lowest possible latency is necessary. For example, when using SDRAM in vehicular applications, there are cases where understanding, on the system side, that a bit error has occurred is more important than actually correcting the bit error using ECC.

Each new generation of DRAM features both faster speeds and more complex control (control protocols), and it is becoming more likely that invalid commands will occur due to problems in the DRAM controller, command errors, and so on. Additionally, control which keeps the DRAM temperature less than or equal to a threshold is important from the standpoint of preventing degradation in the retention performance of the DRAM.

To improve the quality of a system, it would be desirable to realize a method which makes a notification to a device external to the DRAM (that is, to the system) with the lowest possible latency when an invalid command has occurred on the DRAM side or the DRAM temperature has gone above a threshold, without adding any terminals.

This is possible if, for example, the semiconductor chip is provided with an error notification output terminal (output pin) for notifying a device external to the semiconductor chip that an error has occurred. However, adding a new output terminal to the semiconductor chip is problematic in that doing so increases the manufacturing cost of both the semiconductor chip and the DRAM controller.

To solve such a problem, a semiconductor memory device according to one aspect of the present disclosure includes a data bus terminal group for outputting read data to an external device or inputting write data from an external device, a first terminal from or into which 1-bit data is output or input, a DBI circuit that executes a Data Bus Inversion (DBI) function, an error detection circuit that detects an internal error, and an information superimposing circuit that superimposes predetermined output information onto the 1-bit data to be output from the first terminal and the read data to be output from the data bus terminal group. The predetermined output information includes first output information indicating whether or not an output bit pattern of the data bus terminal group is inverted, and second output information indicating whether or not an internal error has been detected by the error detection circuit.

Accordingly, a notification of an internal error in the semiconductor memory device can be made to the external device without adding new terminals to the semiconductor memory device, which suppresses an increase in manufacturing costs. Furthermore, the external device is notified of internal errors using normal memory read operations, which occur frequently, as a trigger, which makes it possible to shorten the time from when the internal error occurs to when the external device is notified of that internal error to the minimum possible latency. Further still, because memory read operations are used as a trigger, it is not necessary to add a special operating mode (or operating commands, or operating sequences) for making internal error notifications. The present technique therefore offers excellent compatibility with existing systems, and can be applied to such systems with minimal changes.

Additionally, a memory controller according to one aspect of the present disclosure is a memory controller that controls readout and writing from and to a semiconductor memory device. The memory controller includes a data bus terminal group for outputting write data to the semiconductor memory device or inputting read data from the semiconductor memory device, a first terminal from or into which 1-bit data is output or input, a DBI circuit that executes a DBI function, and an information detection circuit that detects predetermined output information superimposed on the 1-bit data input to the first terminal from the semiconductor memory device and on an input bit pattern serving as memory read data input to the data bus terminal group from the semiconductor memory device. The predetermined output information includes first output information indicating whether or not the input bit pattern input from the data bus terminal group is inverted, and second output information indicating whether or not an internal error in the semiconductor memory device has been detected.

According to this configuration, the same effects as those described above can be achieved when used in tandem with the above-described semiconductor memory device.

Additionally, an error notification method according to one aspect of the present disclosure is an error notification method for a semiconductor memory device. The device includes a data bus terminal group, a first terminal, and a DBI circuit that executes a DBI function. The method includes detecting a presence or absence of an internal error in the semiconductor memory device, and superimposing predetermined output information onto 1-bit data to be output from the first terminal and read data to be output from the data bus terminal group. The predetermined output information includes first output information indicating whether or not an output bit pattern from the data bus terminal group is inverted, and second output information indicating whether or not an internal error has been detected by an error detection circuit in the semiconductor memory device.

Note that these comprehensive or specific aspects may be realized by a system, a method, an integrated circuit, a computer program, or a computer-readable recording medium such as a CD-ROM, or may be implemented by any desired combination of systems, devices, methods, integrated circuits, computer programs, or recording media.

An embodiment of the present disclosure will be described hereinafter with reference to the drawings.

Note that the following embodiment describes a comprehensive or specific example of the present disclosure. The numerical values, shapes, materials, constituent elements, arrangements and connection states of constituent elements, steps, orders of steps, and the like in the following embodiment are merely examples, and are not intended to limit the present disclosure.

Figure 1:
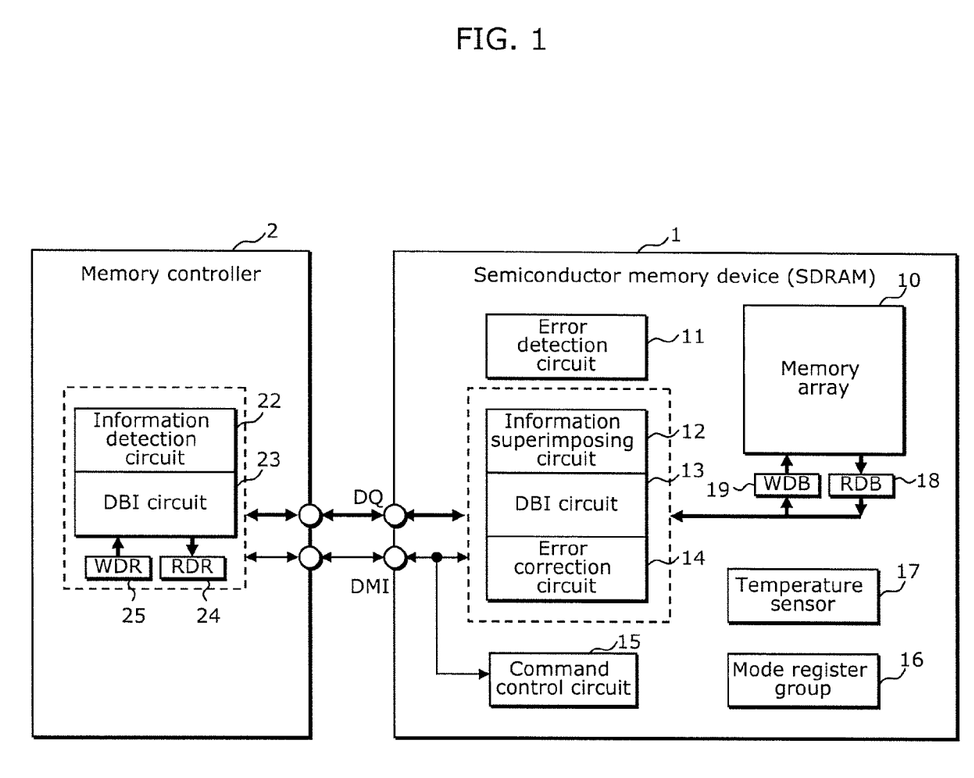
FIG. 1 is a block diagram illustrating an example of the configuration of a semiconductor memory device and a memory controller according to an embodiment.

Embodiment 1.1 Example of Configuration of Semiconductor Memory Device and Memory Controller FIG. 1 is a block diagram illustrating an example of the configuration of semiconductor memory device 1 and memory controller 2 according to the embodiment.

As illustrated in FIG. 1, semiconductor memory device 1 includes data bus terminal group DQ, first terminal DMI, memory array 10, error detection circuit 11, information superimposing circuit 12, DBI circuit 13, error correction circuit 14, command control circuit 15, mode register group 16, temperature sensor 17, read data buffer 18, and write data buffer 19.

Data bus terminal group DQ is a terminal group for outputting read data to an external device or inputting write data from an external device. Data bus terminal group DQ is connected to memory controller 2 via a data bus.

First terminal DMI is a bidirectional input/output terminal from or into which 1-bit data is output or input. "DMI" is an acronym of "Data Mask/Data Bus Inversion". First terminal DMI corresponds to a DMI terminal defined for SDRAM according to the DDR4 or LPDDR4 standards. In this embodiment, first terminal DMI is used not only as a DMI terminal, but also for providing a notification of an internal error from semiconductor memory device 1 to memory controller 2.

Semiconductor memory device 1 includes numerous terminals, e.g., a plurality of terminals defined in the DDR4 or LPDDR4 standard, in addition to first terminal DMI and data bus terminal group DQ, but these are not illustrated in FIG. 1.

Memory array 10 includes capacitors as storage elements. The capacitors are arranged two-dimensionally. Memory array 10 may have a multi-bank configuration or a multi-channel configuration.

Error detection circuit 11 detects an internal error in semiconductor memory device 1. Error detection circuit 11 detects the occurrence of a bit error from error correction circuit 14, detects the input of an invalid command from command control circuit 15, and detects when the temperature of semiconductor memory device 1 has exceeded a threshold from temperature sensor 17. In other words, the internal error includes bit errors, the input of invalid commands, and the temperature exceeding the threshold. Note that the internal error may include status information indicating an abnormal state within semiconductor memory device 1.

Information superimposing circuit 12 superimposes predetermined output information onto the 1-bit data to be output from first terminal DMI and the read data to be output from data bus terminal group DQ. Here, the predetermined output information includes first output information indicating whether or not an output bit pattern from data bus terminal group DQ is inverted, and second output information indicating whether or not an internal error has been detected by error detection circuit 11. In other words, information superimposing circuit 12 superimposes the first output information and the second output information during memory read operations from memory controller 2 to semiconductor memory device 1.

Information superimposing circuit 12 furthermore detects predetermined input information from the 1-bit data input to first terminal DMI and an input bit pattern serving as write data input to data bus terminal group DQ. Here, the predetermined input information includes first input information indicating whether or not the input bit pattern input to data bus terminal group DQ is inverted, and second input information indicating whether or not to mask the write data input to data bus terminal group DQ. In other words, information superimposing circuit 12 detects the first input information and the second input information during memory write operations from memory controller 2 to semiconductor memory device 1.

DBI circuit 13 can execute a DBI function. DBI circuit 13 can switch between activating and deactivating the DBI function.

The DBI function will be described here.

For example, a Low Power DDR4 (LPDDR4)-compliant JO buffer uses a standard called Low Voltage Swing Terminated Logic (LVSTL). A higher amount of power is consumed when the JO buffer drives the data bus at high level (logical 1) via a DQ terminal than when the IO buffer drives the data bus at low level (logical 0).

To reduce the amount of power consumed, in LPDDR4, when the DBI function has been turned on (activated), if five or more bits having logical 1 are present in 8-bit output data from data bus terminal group DQ, the logical values of all the bits in the 8-bit output data are inverted. However, if four or fewer bits having logical 1 are present in the output data, the logical values of all the bits in the 8-bit output data are not inverted.

Accordingly, the number of bits having logical 1 present in the 8-bit output data on the data bus is always less than or equal to four, both when the logical values are and are not inverted. The DMI terminal outputs information indicating whether the 8-bit output data is inverted, in conjunction with that output data.

In this manner, the number of bits having logical 0 present in the output data on the data bus between semiconductor memory device 1 and memory controller 2 is always (i.e., both when inverted and when not inverted) less than or equal to four. In other words, the number of bits having logical 1 present in the output data on the data bus is always (i.e., both when inverted and when not inverted) less than or equal to four. In this manner, the DBI function keeps the number of bits having logical values which increase the amount of power consumed by the IO buffer to less than or equal to half the total bit number of the output data on the data bus. This reduces the power consumption.

However, DDR4 consumes less power when driving at high level (logical 1), which is the opposite from the LPDDR4 and IO buffer standard.

The present embodiment assumes that the amount of power consumed when the IO buffer drives at logical 1 is higher than the amount of power consumed when the IO buffer drives at logical 0, in the same manner as with LPDDR4. The logical value corresponding to the higher power consumption will be called a "predetermined logical value". In other words, the predetermined logical value is a logical value to be suppressed by the DBI function, i.e., a logical value for which the bit number in the output data is to be suppressed.

Note that DBI includes RDBI and WDBI. Here, RDBI refers to DBI used in operations for reading data to memory controller 2 from semiconductor memory device 1. WDBI refers to DBI used in operations for writing data from memory controller 2 to semiconductor memory device 1.

Error correction circuit 14 is a circuit that executes on-die ECC in semiconductor memory device 1. In other words, error correction circuit 14 performs error correction using ECC when a bit error has occurred in semiconductor memory device 1. A bit error occurring in semiconductor memory device 1 is detected by error detection circuit 11.

Command control circuit 15 controls operations of semiconductor memory device 1 in accordance with commands issued to semiconductor memory device 1 from memory controller 2. Command control circuit 15 also determines whether or not a command input to semiconductor memory device 1 is an invalid command. An invalid command occurs when, for example, bit corruption occurs while a command is being transmitted from memory controller 2 to semiconductor memory device 1, or occurs due to a malfunction in memory controller 2. The occurrence of an invalid command is detected by error detection circuit 11.

Mode register group 16 includes a plurality of mode registers. The plurality of mode registers include a mode register for holding detailed information of internal errors detected by error detection circuit 11. When an internal error is detected, error detection circuit 11 writes the detailed information of that internal error into the mode register. This mode register can be read out by memory controller 2. This mode register may be an error log register. The detailed information of the internal error may be error log information that not only indicates the type of the internal error, but also includes the address and data in which the bit error occurred, for example.

Temperature sensor 17 measures the temperature of semiconductor memory device 1. The retention characteristics of memory array 10 degrade as the temperature rises, and the measured temperature is therefore used in temperature control for ensuring that the temperature does not rise above a threshold.

Read data buffer (abbreviated "RDB" hereinafter) 18 is a register serving as a buffer that temporarily holds data read out from memory array 10. The read data held in RDB 18 is subject to processing by information superimposing circuit 12, DBI circuit 13, and error correction circuit 14. The processed read data is output from data bus terminal group DQ via the IO buffer.

Write data buffer (abbreviated "WDB" hereinafter) 19 is a register serving as a buffer that temporarily holds data to be written to memory array 10. The write data from data bus terminal group DQ is subject to processing by information superimposing circuit 12, DBI circuit 13, and error correction circuit 14. The processed write data is held in write data buffer 19.

An example of the configuration of memory controller 2 will be described next.

Memory controller 2 controls the readout and writing from and to semiconductor memory device 1. Memory controller 2 illustrated in FIG. 1 includes data bus terminal group DQ, first terminal DMI, information detection circuit 22, DBI circuit 23, read data register 24, and write data register 25.

Data bus terminal group DQ of memory controller 2 is connected to data bus terminal group DQ of semiconductor memory device 1 via the data bus. Data bus terminal group DQ of memory controller 2 is used to input read data from semiconductor memory device 1 or output write data to semiconductor memory device 1.

First terminal DMI of memory controller 2 is connected to first terminal DMI of semiconductor memory device 1.

Information detection circuit 22 detects the predetermined output information superimposed on the 1-bit data input to first terminal DMI from semiconductor memory device 1 and on the input bit pattern serving as memory read data input to data bus terminal group DQ from semiconductor memory device 1. As described above, the predetermined output information includes the first output information indicating whether or not the input bit pattern input from data bus terminal group DQ is inverted, and the second output information indicating whether or not an internal error has been detected in semiconductor memory device 1.

DBI circuit 23 can execute the WDBI function.

Read data register (abbreviated "RDR" hereinafter) 24 is a register serving as a buffer which temporarily holds memory read data obtained from semiconductor memory device 1 through information detection circuit 22 and DBI circuit 23. If the memory read data held in read data register 24 has undergone bit manipulation such as inversion or non-inversion on the data bus, that data is restored to the original memory read data.

Write data register (abbreviated "WDR" hereinafter) 25 is a register serving as a buffer which temporarily holds memory write data to be written into semiconductor memory device 1. The memory write data in WDR 25 is subject to processing by the WDBI function of DBI circuit 23.

1.2 WDBI and Write Mask

The WDBI function and a write mask implemented by DBI circuit 23 based on the LPDDR4 standard will be described next. "Write mask" refers to a function for instructing whether or not to write each instance of write data (i.e., whether or not to mask the data) in burst writing which writes a plurality of pieces of write data in bursts.

Figure 2A:
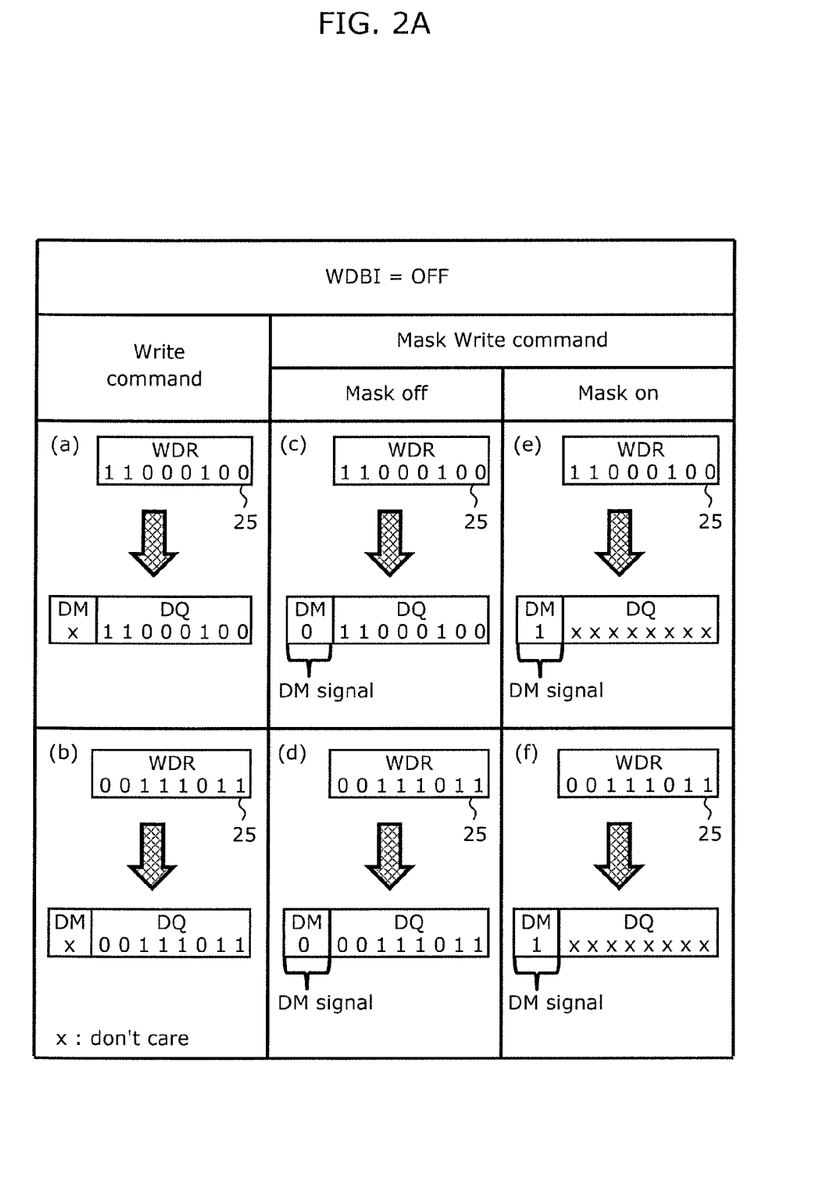
FIG. 2A is a descriptive diagram illustrating an example of normal memory write operations and memory write operations involving a mask, when a WDBI function is off, according to the embodiment.

FIG. 2A is a descriptive diagram illustrating an example of normal memory write operations and memory write operations involving a mask, when the WDBI function is off, according to the embodiment.

In FIG. 2A, (a) to (f) indicate specific examples of the memory write data held in WDR 25, and specific examples of DMI terminal signals and memory write data on data bus terminal group DQ (or on the data bus). In FIG. 2A, "DM" indicates the DMI terminal signal.

In FIG. 2A, (a) and (b) indicate examples of the memory write data in a case where the WDBI function of DBI circuit 23 is off (i.e., inactive) and memory controller 2 has issued a normal write command to semiconductor memory device 1. At this time, the write mask function is off (inactive), and thus the signal of first terminal DMI is "don't care" (any logical value). The WDBI function is also off, and thus the memory write data on the data bus is not inverted.

In FIG. 2A, (c) and (d) indicate examples of the memory write data in a case where the WDBI function of DBI circuit 23 is off (i.e., inactive) and memory controller 2 has issued a mask write command during burst transfer to semiconductor memory device 1. In this example, an instruction to not use a write mask ("mask off") is indicated by logical 0 at first terminal DMI.

In FIG. 2A, (e) and (f) indicate examples of the memory write data in a case where the WDBI function of DBI circuit 23 is off (i.e., inactive) and memory controller 2 has issued a mask write command during burst transfer to semiconductor memory device 1. In this example, an instruction to use a write mask ("mask on") is indicated by logical 1 at first terminal DMI.

In (c) to (f) of FIG. 2A, the signal of first terminal DMI ("DM" in FIG. 2A) indicates not whether or not the memory write data on the data bus is inverted, but rather whether or not to use a write mask.

Figure 2B:
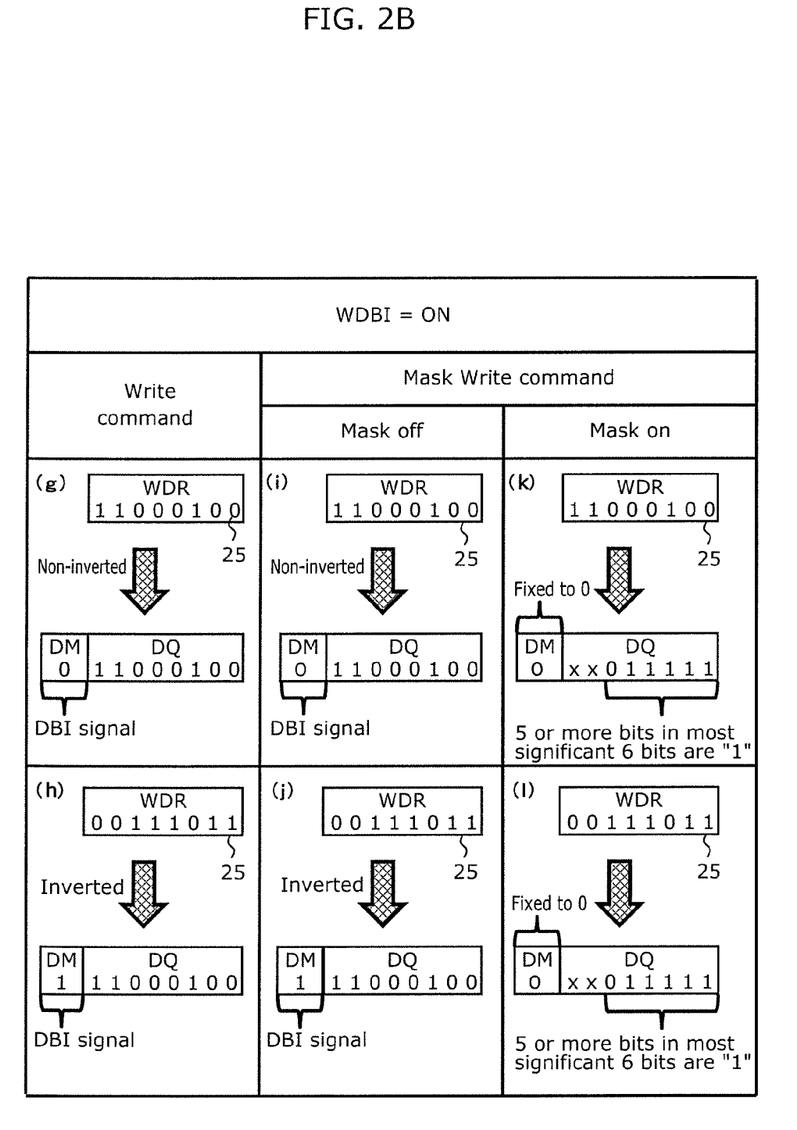
FIG. 2B is a descriptive diagram illustrating an example of normal memory write operations and memory write operations involving a mask, when the WDBI function is on, according to the embodiment.

FIG. 2B is a descriptive diagram illustrating an example of normal memory write operations and memory write operations involving a mask, when the WDBI function is on, according to the embodiment.

In FIG. 2B, (g) and (h) indicate examples of the memory write data in a case where the WDBI function of DBI circuit 23 is on (i.e., active) and memory controller 2 has issued a normal write command to semiconductor memory device 1. At this time, the write mask function is off (inactive), and thus the signal of first terminal DMI indicates whether or not the memory write data on the data bus has been inverted by the WDBI function. (g) in FIG. 2B indicates an example in which the memory write data on the data bus is not inverted. (h) in FIG. 2B indicates an example in which the memory write data on the data bus is inverted.

In FIG. 2B, (i) and (j) indicate examples of the memory write data in a case where the WDBI function of DBI circuit 23 is on (i.e., active) and memory controller 2 has issued a mask write command during burst transfer to semiconductor memory device 1. In this example, there is no explicit instruction to use the write mask, which indicates an implicit instruction to not use the write mask (mask off). At this time, the signal of first terminal DMI indicates whether or not the memory write data on the data bus has been inverted by the WDBI function.

In FIG. 2B, (k) and (l) indicate examples of the memory write data in a case where the WDBI function of DBI circuit 23 is on (i.e., active) and memory controller 2 has issued a mask write command during burst transfer to semiconductor memory device 1. In this example, an instruction to use the write mask (mask on) is indicated by five bits among the most significant six bits in data bus terminal group DQ being logical 1. First terminal DMI is fixed to logical 0 at this time.

As indicated in FIGS. 2A and 2B, the instruction as to whether or not to use a mask is made at the same time as the write data is output from memory controller 2 to semiconductor memory device 1. Whether or not to use a mask is instructed by the DMI terminal signal when the WDBI function is off, and by the bit pattern of data bus terminal group DQ when the WDBI function is on.

In this manner, in semiconductor memory device 1, DBI circuit 23 superimposes the predetermined input information on the 1-bit data input to first terminal DMI and the input bit pattern serving as write data input to data bus terminal group DQ. The predetermined input information includes the first input information indicating whether or not the input bit pattern input to data bus terminal group DQ is inverted, and the second input information indicating whether or not to mask the write data input to data bus terminal group DQ.

1.3 RDBI

An RDBI function compliant with LPDDR4, and an RDBI function performed by DBI circuit 13 according to the embodiment, will be described next.

Figure 3:
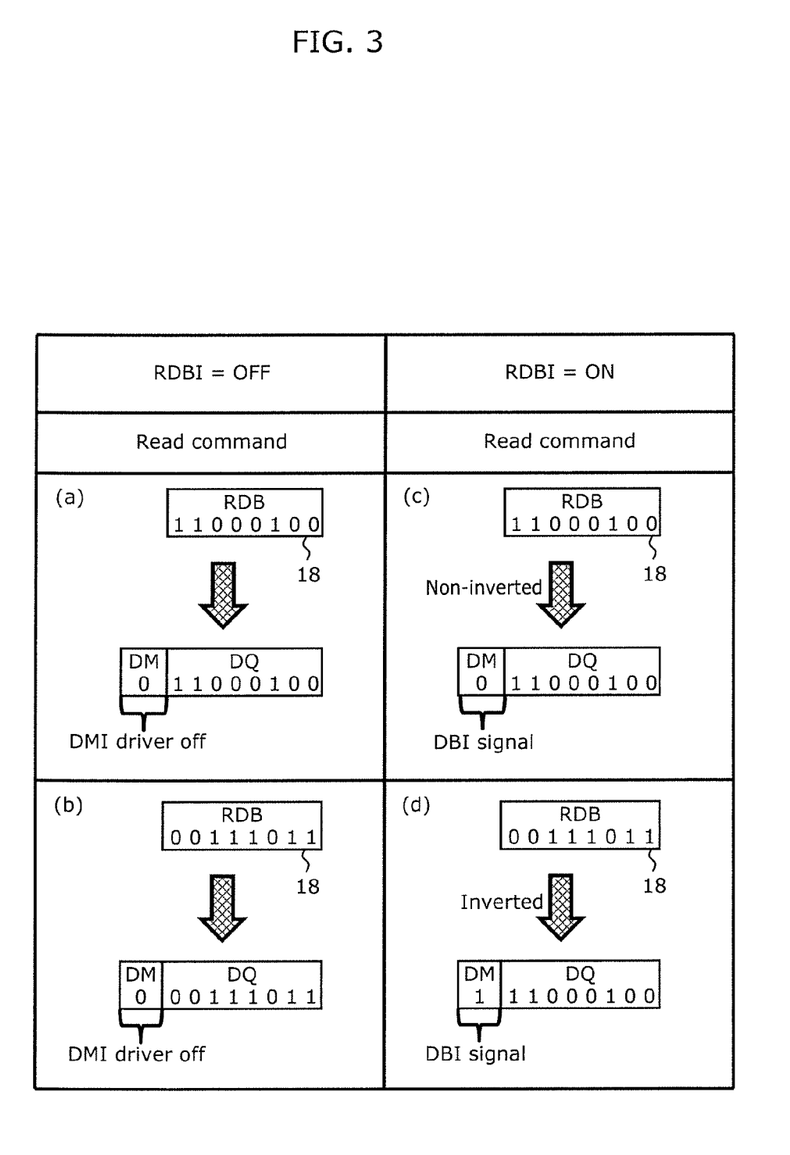
FIG. 3 is a descriptive diagram illustrating an example of memory read operations when an RDBI function compliant with LPDDR4 is on and when the function is off.

FIG. 3 is a descriptive diagram illustrating an example of memory read operations when the RDBI function compliant with LPDDR4 is on and when the function is off.

In FIG. 3, (a) to (d) indicate specific examples of the memory read data held in RDB 18 of semiconductor memory device 1, and specific examples of DMI terminal signals and memory read data on data bus terminal group DQ (or on the data bus). In FIG. 3, "DM" indicates the DMI terminal signal.

In FIG. 3, (a) and (b) indicate examples of the memory read data in a case where the RDBI function of DBI circuit 13 is off (i.e., inactive) and memory controller 2 has issued a normal read command to semiconductor memory device 1. The RDBI function is off (inactive), and thus the signal of first terminal DMI is logical 0, with no indication of being inverted or not inverted.

In FIG. 3, (c) and (d) indicate examples of the memory read data in a case where the RDBI function of DBI circuit 13 is on (i.e., active) and memory controller 2 has issued a normal read command to semiconductor memory device 1. The RDBI function is on (active), and thus the signal of first terminal DMI indicates whether or not the data is inverted. (c) in FIG. 3 indicates an example where the memory read data on the data bus is not inverted. At this time, first terminal DMI is at logical 0, indicating no inversion. (d) in FIG. 3 indicates an example where the memory read data on the data bus is inverted. At this time, first terminal DMI is at logical 1, indicating inversion.

1.4 Internal Error Notification During Memory Read

An example of superimposing the second output information, which indicates whether or not an internal error has been detected, onto the signal of first terminal DMI and the read data of data bus terminal group DQ during memory read operations will be described next.

Figure 4:
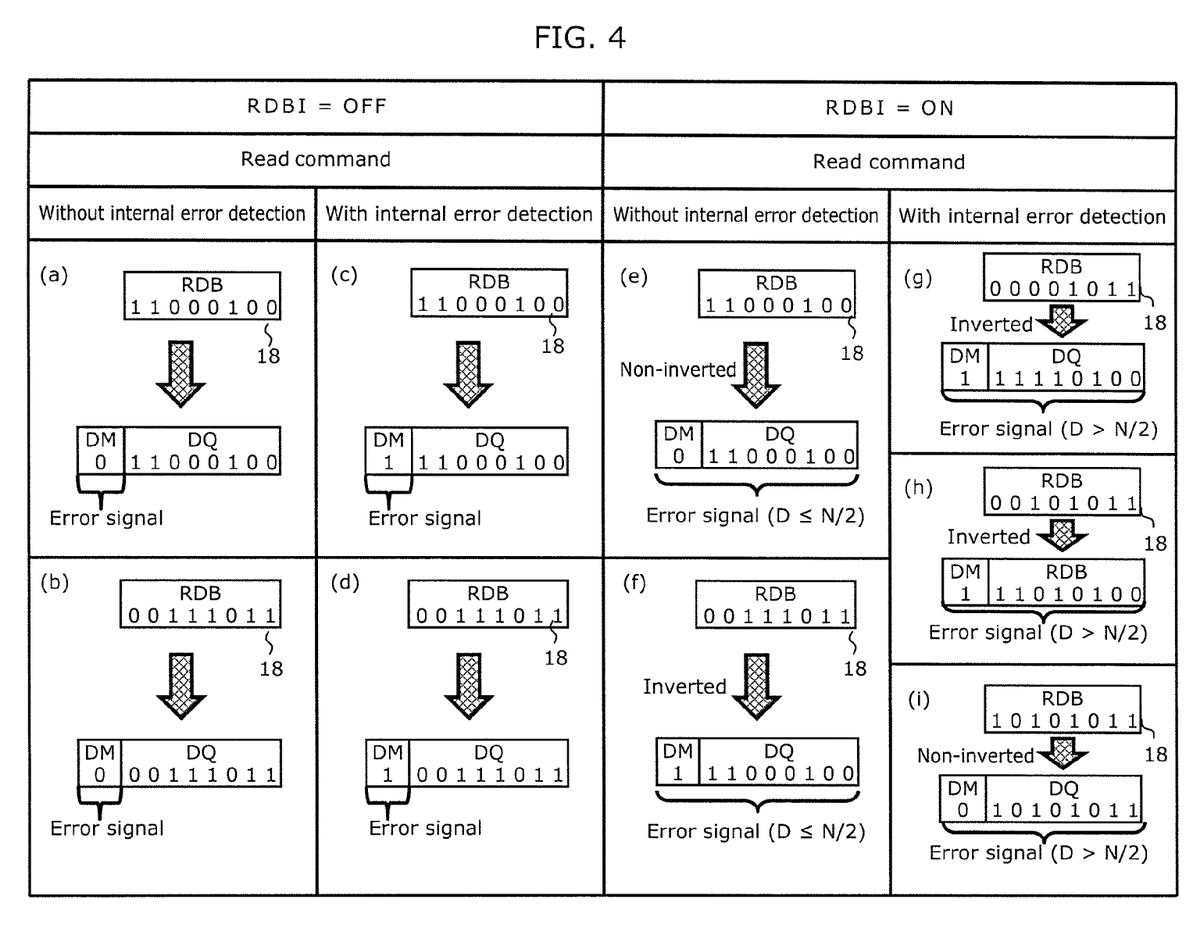
FIG. 4 is a descriptive diagram illustrating an example of operations for superimposing information indicating whether or not an internal error has occurred, when the RDBI function is on and when the RDBI function is off, according to the embodiment.

FIG. 4 is a descriptive diagram illustrating an example of operations for superimposing information indicating whether or not an internal error has occurred, when the RDBI function is on and when the RDBI function is off, according to the embodiment.

In FIG. 4, (a) to (d) indicate examples of operations in a case where the RDBI function of DBI circuit 13 is off (i.e., inactive) and memory controller 2 has issued a normal read command to semiconductor memory device 1.

In FIG. 4, (a) and (b) indicate examples of the memory read data when error detection circuit 11 has not detected an internal error. The RDBI function is off (inactive), and thus the signal of first terminal DMI indicates whether or not an internal error has been detected, with no indication of being inverted or not inverted. In (a) and (b) of FIG. 4, the signal of first terminal DMI is logical 0, indicating that an internal error has not been detected.

In FIG. 4, (c) and (d) indicate examples of the memory read data when error detection circuit 11 has detected an internal error. The RDBI function is off (inactive), and thus the signal of first terminal DMI indicates whether or not an internal error has been detected, with no indication of being inverted or not inverted. In (c) and (d) of FIG. 4, the signal of first terminal DMI is logical 1, indicating that an internal error has been detected.

In FIG. 4, (e) to (i) indicate examples of operations in a case where the RDBI function of DBI circuit 13 is on (i.e., active) and memory controller 2 has issued a normal read command to semiconductor memory device 1.

In FIG. 4, (e) and (f) indicate examples of the memory read data when error detection circuit 11 has not detected an internal error. The RDBI function is on (active), and thus the signal of first terminal DMI indicates inversion/no inversion, without indicating whether or not an internal error has been detected. Whether or not an internal error has been detected is indicated by a number of bits D of a predetermined logical value included in (N+1) bit data constituted by N-bit read data of data bus terminal group DQ (here, N=8) and 1-bit data of first terminal DMI. In (e) and (f) of FIG. 4, the number of bits D of the predetermined logical value is less than or equal to N/2. D≤N/2 being satisfied means that an internal error has not been detected. In other words, when the RDBI function is active and an internal error has not been detected by error detection circuit 11, information superimposing circuit 12 temporarily cancels the RDBI function implemented by DBI circuit 13, and manipulates (sets to inverted or non-inverted) the output bit pattern of the (N+1) bits so that the number of bits of the predetermined logical value included in the (N+1) bit data, which is constituted by the N-bit read data of data bus terminal group DQ and the 1-bit data of first terminal DMI, is less than or equal to N/2. At this time, first terminal DMI indicates whether or not the bit pattern of data bus terminal group DQ is inverted.

In (e) of FIG. 4, D≤N/2 is satisfied as a result of the output bit pattern of the (N+1) bits being manipulated to remain non-inverted. Additionally, in (f) of FIG. 4, D≤N/2 is satisfied as a result of the output bit pattern of the (N+1) bits being manipulated to be inverted. D≤N/2 being satisfied means that an internal error has not been detected.

In FIG. 4, (g) to (i) indicate examples of the memory read data when error detection circuit 11 has detected an internal error. The RDBI function is on (active), and thus the signal of first terminal DMI indicates inversion/no inversion, without indicating whether or not an internal error has been detected. Whether or not an internal error has been detected is indicated by a number of bits D of a predetermined logical value included in (N+1) bit data constituted by N-bit read data of data bus terminal group DQ (here, N=8) and 1-bit data of first terminal DMI. In (g) to (i) of FIG. 4, the number of bits D of the predetermined logical value is greater than N/2. D>N/2 being satisfied means that an internal error has been detected. In other words, when the RDBI function is active and an internal error has been detected by error detection circuit 11, information superimposing circuit 12 temporarily cancels the RDBI function implemented by DBI circuit 13, and manipulates (sets to inverted or non-inverted) the output bit pattern of the (N+1) bits so that the number of bits of the predetermined logical value included in the (N+1) bit data, which is constituted by the N-bit read data of data bus terminal group DQ and the 1-bit data of first terminal DMI, is greater than N/2. At this time, first terminal DMI indicates whether or not the bit pattern of data bus terminal group DQ is inverted.

In (g) and (h) of FIG. 4, D>N/2 is satisfied as a result of the output bit pattern of the (N+1) bits being manipulated to be inverted. Additionally, in (i) of FIG. 4, D>N/2 is satisfied as a result of the output bit pattern of the (N+1) bits being manipulated to be non-inverted.

When the RDBI function is on as indicated in (e) to (i) of FIG. 4, D≤N/2 being satisfied means that an internal error has not been detected. Additionally, when the RDBI function is on, D>N/2 being satisfied means that an internal error has been detected. Accordingly, information detection circuit 22 of memory controller 2 can detect whether or not there is an internal error in semiconductor memory device 1, i.e., can detect the second output information, by determining whether D≤N/2 is satisfied or D>N/2 is satisfied.

1.5 Internal Error Notification Operations of Semiconductor Memory Device 1

An example of operations through which semiconductor memory device 1 notifies memory controller 2 of the second output information, which indicates whether or not an internal error has occurred, will be described next with reference to flowcharts.

Figure 5:
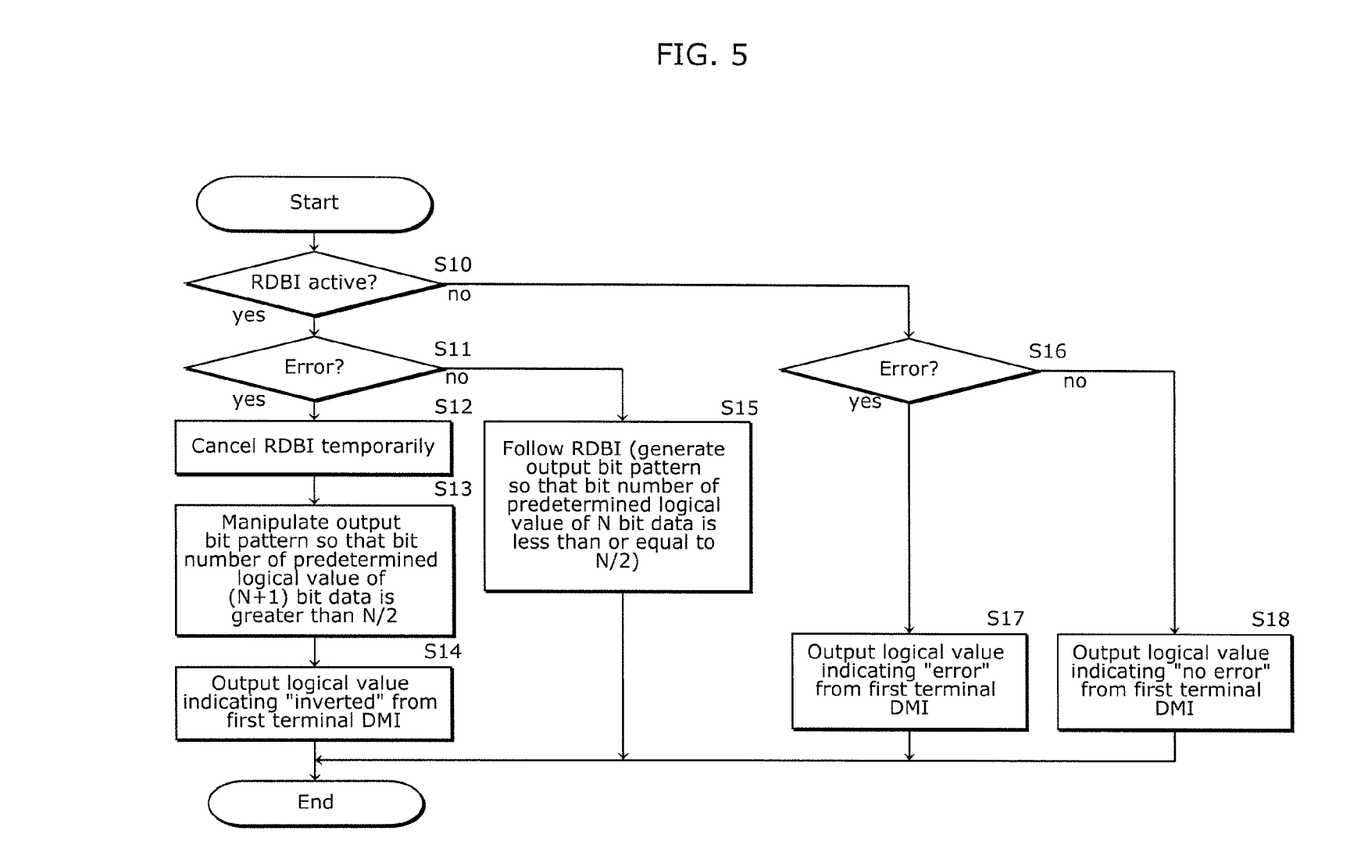
FIG. 5 is a flowchart illustrating an example of error notification operations in the semiconductor memory device according to the embodiment.

FIG. 5 is a flowchart illustrating an example of error notification operations in the semiconductor memory device according to the embodiment.

In FIG. 5, information superimposing circuit 12 determines whether or not the RDBI function is active, and detects whether or not an internal error has been detected (S10, S11, S16).

When it is determined that the DBI function is active and it is determined that an internal error has been detected by error detection circuit 11, information superimposing circuit 12 temporarily cancels the RDBI function implemented by DBI circuit 13 (S12); manipulates (i.e., sets to inverted or non-inverted) the output bit pattern of the (N+1) bits so that the number of bits D of the predetermined logical value included in the (N+1) bit data, which is constituted by the N-bit read data of data bus terminal group DQ and the 1-bit data of first terminal DMI, is greater than N/2 (S13); and outputs, from first terminal DMI, a logical value indicating whether or not the bit pattern of data bus terminal group DQ is inverted (S14).

In other words, when it is determined that the DBI function is active and it is determined that an internal error has been detected by error detection circuit 11, information superimposing circuit 12 temporarily cancels the RDBI function implemented by DBI circuit 13 (S12); manipulates the output bit pattern so that the (N+1) bit data, which is constituted by the N bits of data bus terminal group DQ and the 1 bit of first terminal DMI, works opposite to the DBI function (S13); and outputs, from first terminal DMI, a logical value indicating whether or not the bit pattern of data bus terminal group DQ is inverted (S14).

Through S14, memory controller 2 can detect whether or not there is an internal error in semiconductor memory device 1, i.e., can detect the second output information, as a result of D>N/2 being satisfied (working opposite to the DBI function).

Additionally, when it is determined that the RDBI function is active and it is determined that an internal error has not been detected by error detection circuit 11, information superimposing circuit 12 follows the RDBI function of DBI circuit 13 (S15). Due to the RDBI function, the number of bits of the predetermined logical value included in the (N+1) bit data becomes less than or equal to N/2.

Through S14, memory controller 2 can detect whether or not there is an internal error in semiconductor memory device 1, i.e., can detect the second output information, as a result of D<N/2 being satisfied (not working opposite to the DBI function).

Additionally, when it is determined that the RDBI function is inactive, information superimposing circuit 12 outputs binary information indicating whether or not an internal error has been detected from first terminal DMI as the second output information (S17, S18).

Figure 6:
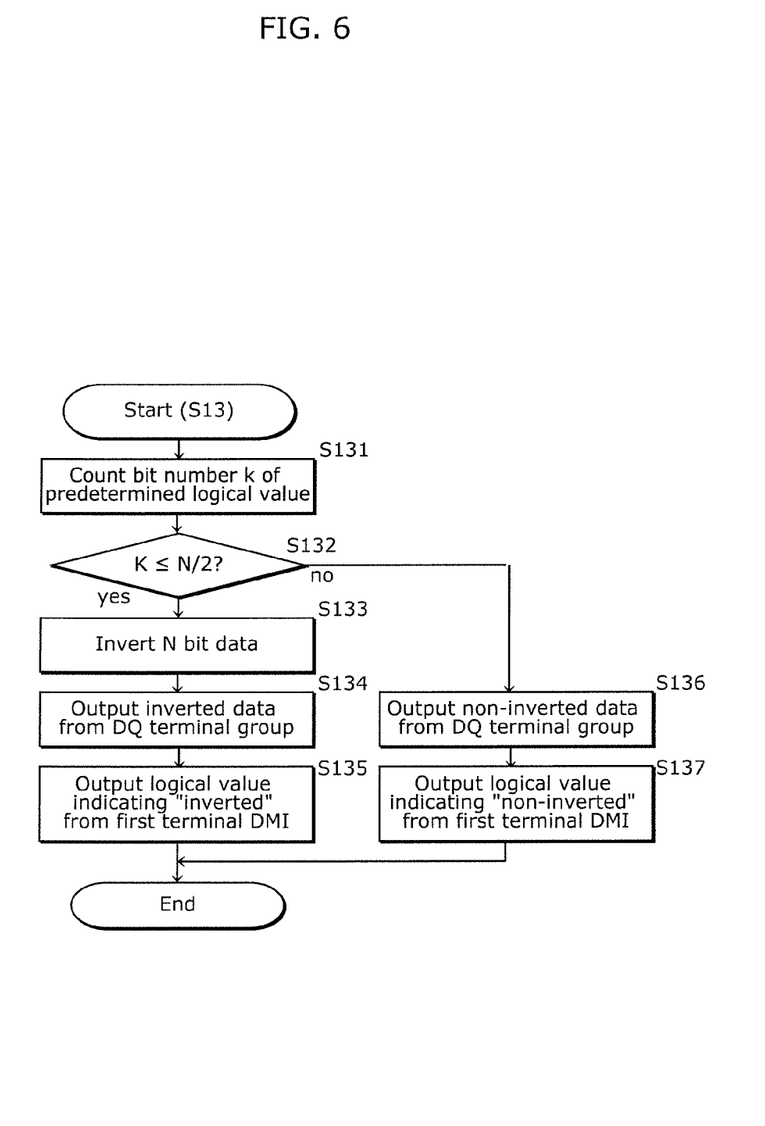
FIG. 6 is a flowchart illustrating a specific example for step S13 in FIG. 5.

FIG. 6 is a flowchart illustrating a specific example for step S13 in FIG. 5.

When it is determined that the DBI function is active and that an internal error has been detected by error detection circuit 11, information superimposing circuit 12 counts a number of bits k of the predetermined logical value included in the N-bit data to be output to the external device from data bus terminal group DQ (S131) and determines whether or not k is less than or equal to N/2 (S132).

If it is determined that k is less than or equal to N/2 (yes in S132), information superimposing circuit 12 inverts the N-bit data (S133), outputs the inverted N-bit data from data bus terminal group DQ (S134), and furthermore outputs a logical value indicating that the bit pattern of data bus terminal group DQ has been inverted from first terminal DMI (S135).

However, if it is determined that k is greater than N/2 (no in S132), information superimposing circuit 12 outputs the non-inverted N-bit data from data bus terminal group DQ (S136), and furthermore outputs a logical value indicating that the bit pattern of data bus terminal group DQ is not inverted from first terminal DMI (S137).

Figure 7:
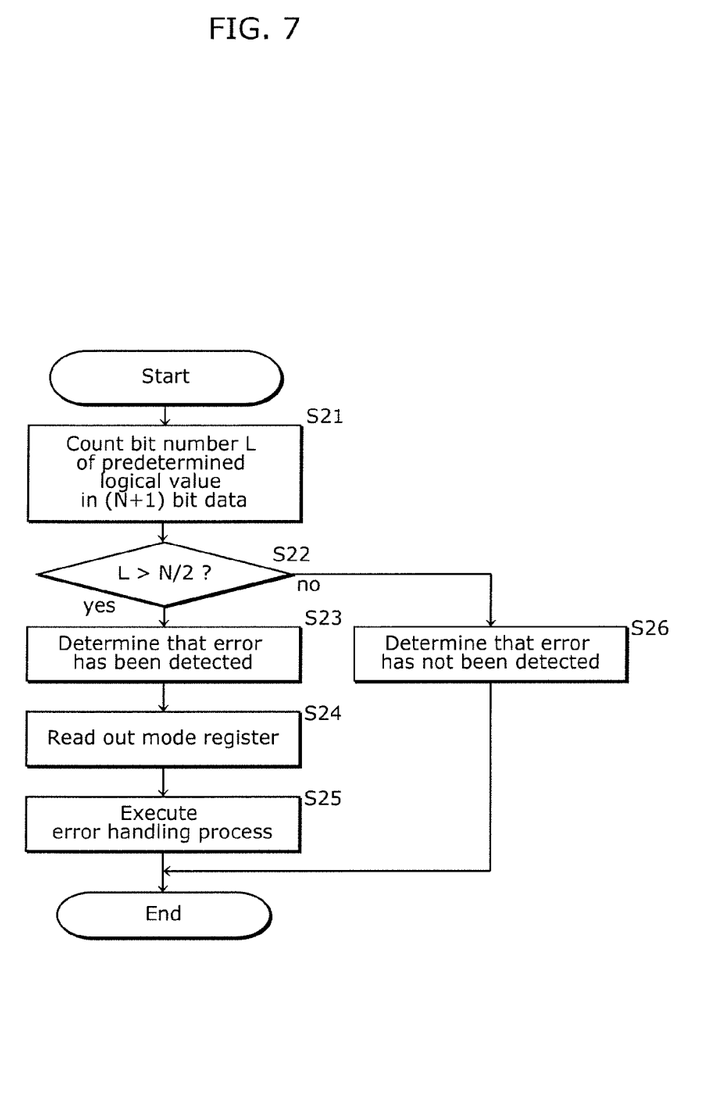
FIG. 7 is a flowchart illustrating an example of operations for detecting an error notification in memory controller according to the embodiment.

As illustrated in FIGS. 6 and 7, when the RDBI function is on, information superimposing circuit 12 superimposes, on the (N+1) bit data, an indication that an internal error has not been detected, as a result of D≤N/2 being satisfied. Additionally, when the RDBI function is on, information superimposing circuit 12 superimposes, on the (N+1) bit data, an indication that an internal error has been detected, as a result of D>N/2 being satisfied. Accordingly, when the RDBI function is on, information detection circuit 22 of memory controller 2 can detect whether or not there is an internal error in semiconductor memory device 1, i.e., can detect the second output information, by determining whether D≤N/2 is satisfied or D>N/2 is satisfied.

1.6 Internal Error Notification Detection Operations of Memory Controller 2

An example of operations through which information detection circuit 22 detects an error notification (i.e., the second output information) will be described with reference to a flowchart.

FIG. 7 is a flowchart illustrating an example of operations for detecting an error notification in memory controller 2 according to the embodiment.

When the RDBI function is active, information detection circuit 22 counts a number of bits L of the predetermined logical value included in the N+1 bit data constituted by the input bits of first terminal DMI and the input bit pattern of data bus terminal group DQ (S21), and then determines whether or not L is greater than N/2 (S22).

If it is determined that L is greater than N/2, information detection circuit 22 determines that an error has been detected (S23), reads out detailed data of the internal error from the mode register in semiconductor memory device 1 (S24), and executes processing for handling the internal error (S25).

On the other hand, if it is determined that L is not greater than N/2, information detection circuit 22 determines that an internal error has not been detected (S26).

Note that when the RDBI function is inactive, information detection circuit 22 of memory controller 2 detects a binary logical value of first terminal DMI as the second output information indicating whether or not an internal error has occurred.

According to semiconductor memory device 1 and memory controller 2 of the embodiment described thus far, the external memory controller 2 can be notified of internal errors in semiconductor memory device 1 without adding new terminals to semiconductor memory device 1, which suppresses an increase in manufacturing costs. Furthermore, the external device is notified of internal errors using normal memory read operations, which occur frequently, as a trigger, which makes it possible to shorten the time from when the internal error occurs to when the external device is notified of that internal error to the minimum possible latency. Further still, it is not necessary to add a special operating mode (or operating commands, or operating sequences) for making internal error notifications. The present technique therefore offers excellent compatibility with existing systems, and can be applied to such systems with minimal changes.

Although the embodiment describes an example in which the number of bits N in data bus terminal group DQ is 8, note that N may be a multiple of 8. When N is a multiple of 8 (N=8×n), first terminal DMI may be provided for every 8 bits of data bus terminal group DQ, i.e., n first terminals DMI may be provided.

Additionally, although semiconductor memory device 1 is described as being compatible with SDRAM according to the DDR4 and LPDDR4 standards, the device compatibility is not limited thereto. For example, semiconductor memory device 1 may be compatible with DDR5, LPDDR5, GDDR6, or the like.

As described thus far, semiconductor memory device 1 according to the embodiment includes data bus terminal group DQ for outputting read data to the external device or inputting write data from the external device, first terminal DMI from or into which 1-bit data is output or input, DBI circuit 13 that executes a Data Bus Inversion (DBI) function, error detection circuit 11 that detects an internal error, and information superimposing circuit 12 that superimposes predetermined output information onto the 1-bit data to be output from first terminal DMI and the read data to be output from data bus terminal group DQ. The predetermined output information includes first output information indicating whether or not an output bit pattern of data bus terminal group DQ is inverted, and second output information indicating whether or not an internal error has been detected by error detection circuit 11.

Accordingly, the external memory controller 2 can be notified of an internal error in semiconductor memory device 1 without adding new terminals to semiconductor memory device 1, which suppresses an increase in manufacturing costs.

Here, information superimposing circuit 12 may furthermore extract predetermined input information from the 1-bit data input to first terminal DMI and an input bit pattern serving as the write data input to data bus terminal group DQ; and the predetermined input information may include first input information indicating whether or not the input bit pattern input to data bus terminal group DQ is inverted, and second input information indicating whether or not writing of the write data input to data bus terminal group DQ is to be masked.

Here, a total number of terminals in data bus terminal group DQ may be N. DBI circuit 13 may be capable of switching between activating and inactivating the DBI function. When the DBI function is inactive, information superimposing circuit 12 may output binary information indicating whether or not an internal error has been detected from the first terminal as the second output information. When the DBI function is active and an internal error has been detected by error detection circuit 11, information superimposing circuit 12 may temporarily cancel the DBI function implemented by the DBI circuit, manipulate an output bit pattern of N+1 bits so that a total number of bits of a predetermined logical value included in N+1 bit data is greater than N/2, the N+1 bit data being constituted by N bits of read data of data bus terminal group DQ and the 1-bit data of the first terminal, and output a logical value indicating whether or not the output bit pattern of data bus terminal group DQ is inverted from the first terminal. When the DBI function is active and an internal error has been detected by error detection circuit 11, information superimposing circuit 12 may manipulate the output bit pattern of (N+1) bits so that the total number of bits of the predetermined logical value included in the N+1 bit data is less than or equal to N/2, and output a logical value indicating whether or not the output bit pattern of data bus terminal group DQ is inverted from the first terminal. The predetermined logical value may be a logical value to be suppressed by the DBI function.

Here, a total number of terminals in data bus terminal group DQ may be N. DBI circuit 13 may be capable of switching between activating and inactivating the DBI function. When the DBI function is inactive, information superimposing circuit 12 may output binary information indicating whether or not an internal error has been detected from the first terminal as the second output information. When the DBI function is active and an internal error has been detected by error detection circuit 11, information superimposing circuit 12 may temporarily cancel the DBI function implemented by the DBI circuit, manipulate the output bit pattern of (N+1) bits so that N+1 bit data works opposite to the DBI function, the N+1 bit data being constituted by N bits of data bus terminal group DQ and 1 bit of the first terminal, and output a logical value indicating whether or not the output bit pattern of data bus terminal group DQ is inverted from the first terminal. When the DBI function is active and an internal error has not been detected by error detection circuit 11, information superimposing circuit 12 may manipulate the output bit pattern of (N+1) bits so that the N+1 bit data does not work opposite to the DBI function, and output a logical value indicating whether or not the output bit pattern of data bus terminal group DQ is inverted from the first terminal.

Here, a total number of terminals in data bus terminal group DQ may be N. DBI circuit 13 may be capable of switching between activating and inactivating the DBI function. When the DBI function is inactive, information superimposing circuit 12 may output binary information indicating whether or not an internal error has been detected from the first terminal as the second output information. When the DBI function is active and an internal error has been detected by error detection circuit 11, information superimposing circuit 12 may temporarily cancel the DBI function implemented by the DBI circuit, and when a total number of bits of a predetermined logical value included in N-bit data to be output to the external device from data bus terminal group DQ is less than or equal to N/2, information superimposing circuit 12 may supply inverted N-bit data to data bus terminal group DQ, and may furthermore output a logical value indicating that the output bit pattern of data bus terminal group DQ is inverted from the first terminal. When the DBI function is active and an internal error has not been detected by error detection circuit 11, information superimposing circuit 12 may not cancel the DBI function implemented by the DBI circuit.

Here, when the DBI function is active and an internal error has not been detected by error detection circuit 11, and the total number of bits of the predetermined logical value included in N-bit data to be output to the external device from data bus terminal group DQ is greater than N/2, DBI circuit 13 may supply data that is inverted from the N-bit data to data bus terminal group DQ, and may output a logical value indicating that the output bit pattern of data bus terminal group DQ is inverted from the first terminal as the first output information. When the DBI function is active and an internal error has not been detected by error detection circuit 11, and the total number of bits of the predetermined logical value included in the N-bit data is less than or equal to N/2, DBI circuit 13 may supply the N-bit data that is not inverted to data bus terminal group DQ, and may output a logical value indicating that the output bit pattern of data bus terminal group DQ is not inverted from the first terminal as the first output information. The predetermined logical value may be a logical value to be suppressed by the DBI function.

Accordingly, when the DBI function is inactive, and an internal error has been detected by error detection circuit 11, the second output information is output as the output bit of first terminal DMI on the data bus. When the DBI function is inactive, the logical value of first terminal DMI indicates whether or not an internal error has occurred, and thus memory controller 2 can easily detect whether or not an internal error has occurred in semiconductor memory device 1.

On the other hand, when the DBI function is active and an internal error has been detected by error detection circuit 11, the second output information is superimposed on the (N+1) bit data on the data bus, the (N+1) bit data being the total of the output bit of first terminal DMI and the N-bit data output by data bus terminal group DQ.

In other words, when the DBI function is active and an internal error has been detected, the number of bits of the predetermined logical value included in the (N+1) bit data is greater than N/2. Conversely, when the DBI function is active and an internal error is not detected, the number of bits of the predetermined logical value is less than or equal to N/2.

When the DBI function is active and the number of bits of the predetermined logical value included in the (N+1) bit data is greater than N/2, memory controller 2 determines that an internal error has been detected. Conversely, when the DBI function is active and the number of bits of the predetermined logical value included in the (N+1) bit data is less than or equal to N/2, memory controller 2 determines that an internal error has not been detected.

Here, semiconductor memory device 1 may further include memory array 10 including a capacitor as a storage element and error correction circuit 14 that corrects a bit error between memory array 10 and data bus terminal group DQ, and error detection circuit 11 may detect an occurrence of the bit error as one instance of the internal error.

Here, semiconductor memory device 1 may further include temperature sensor 17 that senses an internal temperature, and error detection circuit 11 may detect the internal temperature exceeding a threshold as one instance of the internal error.

Here, error detection circuit 11 may detect an input of an invalid command from the external device as one instance of the internal error.

Additionally, memory controller 2 according to the embodiment is a memory controller that controls readout and writing from and to semiconductor memory device 1. Memory controller 2 includes data bus terminal group DQ for outputting write data to semiconductor memory device 1 or inputting read data from semiconductor memory device 1, first terminal DMI from or into which 1-bit data is output or input, DBI circuit 23 that executes a DBI function, and information detection circuit 22 that detects predetermined output information superimposed on the 1-bit data input to first terminal DMI from semiconductor memory device 1 and on an input bit pattern serving as memory read data input to data bus terminal group DQ from semiconductor memory device 1. The predetermined output information includes first output information indicating whether or not the input bit pattern input from data bus terminal group DQ is inverted, and second output information indicating whether or not an internal error in semiconductor memory device 1 has been detected.

Here, when the DBI function is inactive, information detection circuit 22 may detect a binary logical value of first terminal DMI as the second output information. When the DBI function is active, information detection circuit 22 may detect, as the second output information, a total number of bits of the predetermined logical value included in N+1 bit data, the N+1 bit data being constituted by the input bit of first terminal DMI and the input bit pattern of data bus terminal group DQ. When the total number of bits of the predetermined logical value is greater than N/2, information detection circuit 22 may determine that the internal error has been detected, and when the total number of bits of the predetermined logical value is less than or equal to N/2, information detection circuit 22 may determine that the internal error has not been detected. The predetermined logical value may be a logical value to be suppressed by the DBI function.

Additionally, an error notification method for a semiconductor memory device according to the embodiment is an error notification method for a semiconductor memory device. Semiconductor memory device 1 includes data bus terminal group DQ, first terminal DMI, and DBI circuit 13 that executes a DBI function. The method includes detecting a presence or absence of an internal error in semiconductor memory device 1, and superimposing predetermined output information onto 1-bit data to be output from first terminal DMI and read data to be output from data bus terminal group DQ. The predetermined output information includes first output information indicating whether or not an output bit pattern from data bus terminal group DQ is inverted, and second output information indicating whether or not an internal error has been detected by error detection circuit 11.

Here, in the superimposing of the predetermined output information: when the DBI function is inactive, binary information indicating whether or not an internal error has been detected may be output from the first terminal as the second output information. The DBI function implemented by the DBI circuit may be temporarily canceled, an output bit pattern of N+1 bits may be manipulated so that a total number of bits of a predetermined logical value included in N+1 bit data is greater than N/2, the N+1 bit data being constituted by N-bit read data of data bus terminal group DQ and the 1-bit data of the first terminal, and a logical value indicating whether or not the output bit pattern of data bus terminal group DQ is inverted may be output from the first terminal, when the DBI function is active and an internal error has been detected by error detection circuit 11. The output bit pattern of (N+1) bits may be manipulated so that the total number of bits of the predetermined logical value included in the N+1 bit data is less than or equal to N/2, and a logical value indicating whether or not the output bit pattern of data bus terminal group DQ is inverted may be output from the first terminal, when the DBI function is active and an internal error has not been detected by error detection circuit 11. The predetermined logical value may be a logical value to be suppressed by the DBI function.

The foregoing has described semiconductor memory device 1 and memory controller 2 on the basis of an embodiment. However, the present disclosure is not intended to be limited to this embodiment. Various conceivable variations made on the present embodiment by one skilled in the art also fall within the scope of the present disclosure as long as those variations do not depart from the essential spirit of the present disclosure.

In the foregoing embodiment, the constituent elements are constituted by dedicated hardware. However, the constituent elements may be realized by executing software programs corresponding to those constituent elements. Each constituent element may be realized by a program executing unit such as a CPU or a processor reading out and executing a software program recorded into a recording medium such as a hard disk or semiconductor memory.

While various embodiments have been described herein above, it is to be appreciated that various changes in form and detail may be made without departing from the spirit and scope of the present disclosure as presently or hereafter claimed.

FURTHER INFORMATION ABOUT TECHNICAL BACKGROUND TO THIS APPLICATION

The disclosure of the following Japanese Patent Application including specification, drawings and claims is incorporated herein by reference in its entirety: Japanese Patent Application No. 2019-127434 filed on Jul. 9, 2019.

INDUSTRIAL APPLICABILITY

The present disclosure can be applied in semiconductor memory devices and memory controllers.

The invention claimed is:

1. A semiconductor memory device, comprising:
a data bus terminal group for outputting read data to an external device or inputting write data from the external device;
a first terminal from or into which 1-bit data is output or input;
a DBI circuit that executes a Data Bus Inversion (DBI) function;
an error detection circuit that detects an internal error; and
an information superimposing circuit that superimposes predetermined output information onto the 1-bit data to be output from the first terminal and the read data to be output from the data bus terminal group,
wherein the predetermined output information includes:
first output information indicating whether or not an output bit pattern of the data bus terminal group is inverted; and
second output information indicating whether or not the internal error has been detected by the error detection circuit,
the information superimposing circuit further extracts predetermined input information from the 1-bit data input to the first terminal and an input bit pattern serving as the write data input to the data bus terminal group,
the predetermined input information includes:
first input information indicating whether or not the input bit pattern input to the data bus terminal group is inverted; and
second input information indicating whether or not writing of the write data input to the data bus terminal group is to be masked.

2. The semiconductor memory device according to claim 1,
wherein a total number of terminals in the data bus terminal group is N,
the DBI circuit is capable of switching between activating and inactivating the DBI function,
when the DBI function is inactive, the information superimposing circuit outputs binary information indicating whether or not the internal error has been detected from the first terminal as the second output information,
when the DBI function is active and the internal error has been detected by the error detection circuit, the information superimposing circuit temporarily cancels the DBI function implemented by the DBI circuit, manipulates an output bit pattern of (N+1) bits so that a total number of bits of a predetermined logical value included in (N+1) bit data is greater than N/2, the (N+1) bit data being constituted by N bits of read data of the data bus terminal group and the 1-bit data of the first terminal, and outputs a logical value indicating whether or not the output bit pattern of the data bus terminal group is inverted from the first terminal,
when the DBI function is active and the internal error has not been detected by the error detection circuit, the information superimposing circuit manipulates the output bit pattern of (N+1) bits so that the total number of bits of the predetermined logical value included in the (N+1) bit data is less than or equal to N/2, and outputs the logical value indicating whether or not the output bit pattern of the data bus terminal group is inverted from the first terminal, and
the predetermined logical value is to be suppressed by the DBI function.

3. The semiconductor memory device according to claim 1,
wherein a total number of terminals in the data bus terminal group is N,
the DBI circuit is capable of switching between activating and inactivating the DBI function,
when the DBI function is inactive, the information superimposing circuit outputs binary information indicating whether or not the internal error has been detected from the first terminal as the second output information,
when the DBI function is active and the internal error has been detected by the error detection circuit, the information superimposing circuit temporarily cancels the DBI function implemented by the DBI circuit, manipulates the output bit pattern of (N+1) bits so that (N+1) bit data works opposite to the DBI function, the (N+1) bit data being constituted by N bits of the data bus terminal group and 1 bit of the first terminal, and outputs a logical value indicating whether or not the output bit pattern of the data bus terminal group is inverted from the first terminal, and
when the DBI function is active and the internal error has not been detected by the error detection circuit, the information superimposing circuit manipulates the output bit pattern of (N+1) bits so that the (N+1) bit data does not work opposite to the DBI function, and outputs the logical value indicating whether or not the output bit pattern of the data bus terminal group is inverted from the first terminal.

4. The semiconductor memory device according to claim 1,
wherein a total number of terminals in the data bus terminal group is N,
the DBI circuit is capable of switching between activating and inactivating the DBI function, and
when the DBI function is inactive, the information superimposing circuit outputs binary information indicating whether or not the internal error has been detected from the first terminal as the second output information,
when the DBI function is active and the internal error has been detected by the error detection circuit, the information superimposing circuit temporarily cancels the DBI function implemented by the DBI circuit, and when a total number of bits of a predetermined logical value included in N-bit data to be output to the external device from the data bus terminal group is less than or equal to N/2, the information superimposing circuit supplies inverted N-bit data to the data bus terminal group, and furthermore outputs a logical value indicating that the output bit pattern of the data bus terminal group is inverted from the first terminal, and
when the DBI function is active and the internal error has not been detected by the error detection circuit, the information superimposing circuit does not cancel the DBI function implemented by the DBI circuit.

5. The semiconductor memory device according to claim 2,
wherein when the DBI function is active and the internal error has not been detected by the error detection circuit, and the total number of bits of the predetermined logical value included in N-bit data to be output to the external device from the data bus terminal group is greater than N/2, the DBI circuit supplies data that is inverted from the N-bit data to the data bus terminal group, and outputs the logical value indicating that the output bit pattern of the data bus terminal group is inverted from the first terminal as the first output information,
when the DBI function is active and the internal error has not been detected by the error detection circuit, and the total number of bits of the predetermined logical value included in the N-bit data is less than or equal to N/2, the DBI circuit supplies the N-bit data that is not inverted to the data bus terminal group, and outputs the logical value indicating that the output bit pattern of the data bus terminal group is not inverted from the first terminal as the first output information.

6. The semiconductor memory device according to claim 1, further comprising:
a memory array including a capacitor as a storage element; and
an error correction circuit that corrects a bit error between the memory array and the data bus terminal group,
wherein the error detection circuit detects an occurrence of the bit error as one instance of the internal error.

7. The semiconductor memory device according to claim 1, further comprising:
a temperature sensor that senses an internal temperature,
wherein the error detection circuit detects the internal temperature exceeding a threshold as one instance of the internal error.

8. The semiconductor memory device according to claim 1,
wherein the error detection circuit detects an input of an invalid command from the external device as one instance of the internal error.

* * * * *